United States Patent [19]

Kim

[11] Patent Number: 5,362,661
[45] Date of Patent: Nov. 8, 1994

[54] METHOD FOR FABRICATING THIN FILM TRANSISTOR

[75] Inventor: Hong K. Kim, Kyungki-do, Rep. of Korea

[73] Assignee: Gold Star Co., Ltd., Seoul, Rep. of Korea

[21] Appl. No.: 152,330

[22] Filed: Nov. 15, 1993

[30] Foreign Application Priority Data

Nov. 20, 1992 [KR] Rep. of Korea ............... 21925/1992

[51] Int. Cl.$^5$ .......................................... H01L 21/265
[52] U.S. Cl. ..................................... 437/40; 437/913;
437/978; 148/DIG. 114; 148/DIG. 150
[58] Field of Search ............... 437/40, 913, 978, 241,
437/62, 29, 41, 42; 148/DIG. 150, DIG. 114, 117

[56] References Cited

U.S. PATENT DOCUMENTS

| | | | |
|---|---|---|---|
| 3,974,515 | 8/1976 | Ipri et al. | 148/DIG. 85 |
| 4,104,087 | 8/1978 | Ipri et al. | 437/42 |
| 4,419,812 | 12/1983 | Topich | 437/42 |
| 4,587,711 | 5/1986 | Godejahn, Jr. | 437/42 |
| 5,130,264 | 7/1992 | Troxell et al. | 148/DIG. 150 |

FOREIGN PATENT DOCUMENTS 5976473  5/1984  Japan ................................. 437/913

Primary Examiner—Tom Thomas
Assistant Examiner—Michael Trinh
Attorney, Agent, or Firm—John P. White

[57] ABSTRACT

The method comprising the steps of: depositing a semiconductor layer serving as an active layer, a first gate insulation film and an second gate insulation film on an insulation-transparent substrate, in this order; patterning the second gate insulation film using a mask for the patterning of an active region so that it is remained merely at the active region; oxidizing the semiconductor layer except for the active region using the patterned second gate insulation film as an oxidization mask, to isolate the active region from the other portion; forming a gate electrode on the second gate insulation film corresponding to the upper side of the defined active region; implanting impurity-ions in the semiconductor layer using the gate electrode as an ion-implantation mask to form a source region and a drain region; forming a protection film on the whole exposed surface of the resultant structure; forming contact holes in the protection layer so that the source region and the drain region are exposed; and forming a source electrode and a drain electrode, so that they are connected to the source region and the drain region, respectively, via the contact holes.

5 Claims, 4 Drawing Sheets

F I G.2a
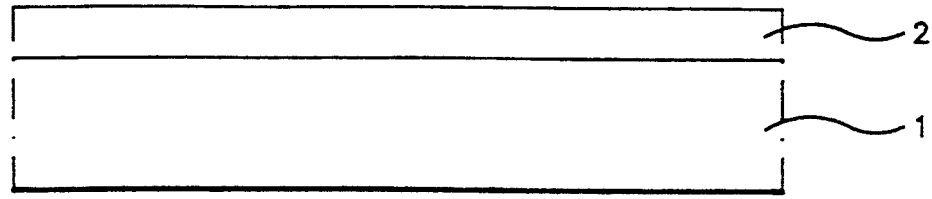

F I G.2b
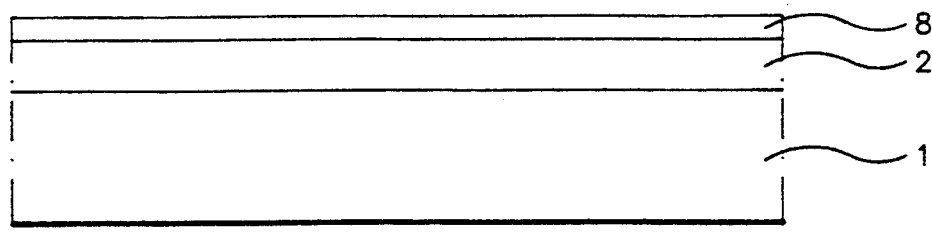
F I G.2c
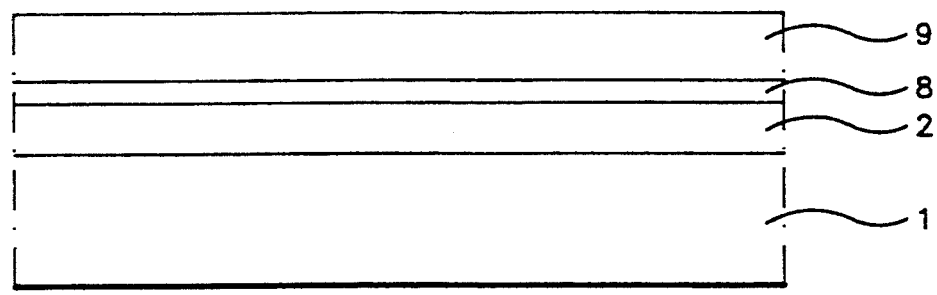
F I G.2d
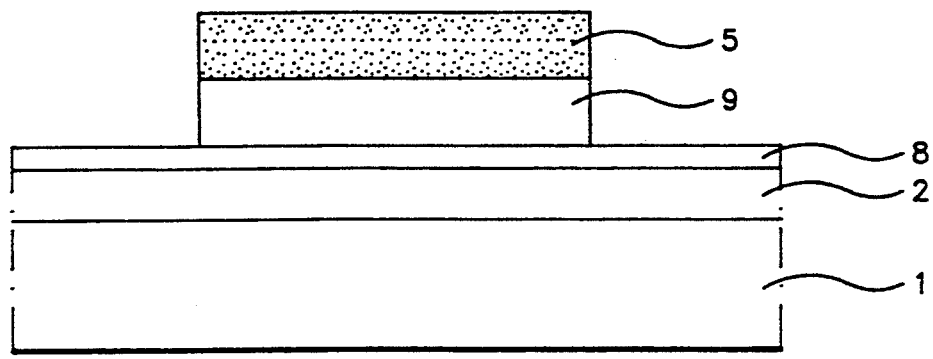
F I G.2e
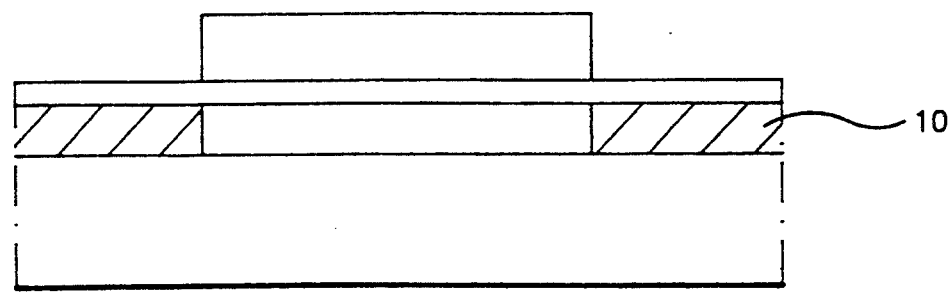

F I G. 2f
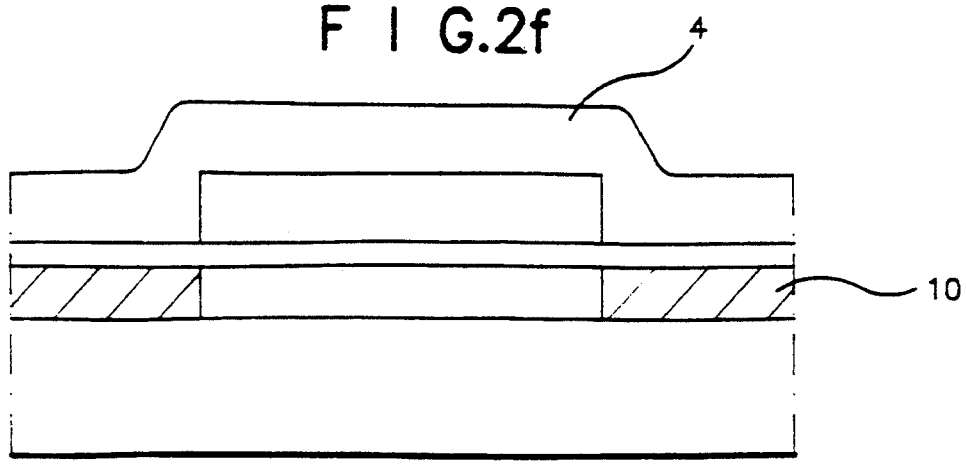
F I G. 2g
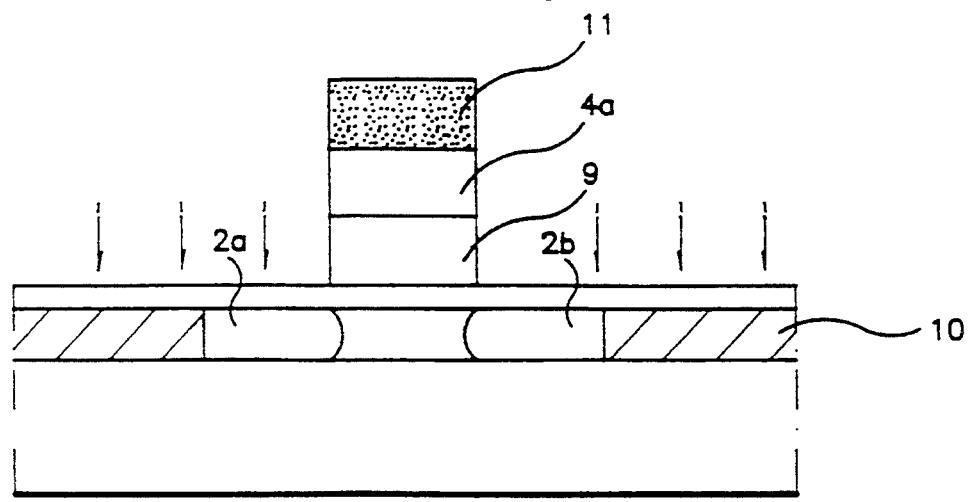
F I G. 2h
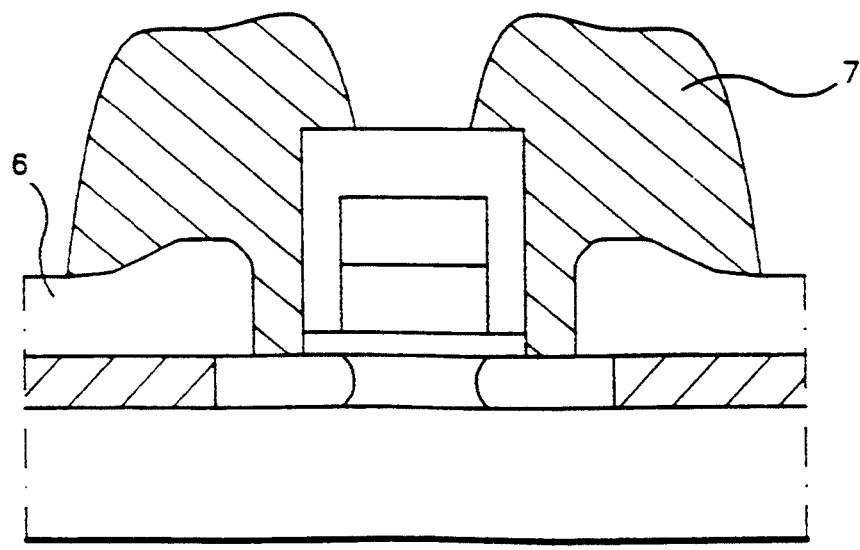

METHOD FOR FABRICATING THIN FILM TRANSISTOR

BACKGROUND OF THE INVENTION

The present invention relates to a method for fabricating a thin film transistor, and more particularly to a method capable of improving characteristics at the boundary surface between a gate insulation film and an active layer, such as adhesion power, lattice-breakdown, impurity implantation.

In general, thin film transistors are widely employed as switching devices in liquid crystal display devices or contact image sensors.

Therefore, this film transistors must be operated in high speed. So as to operate thin film transistors in high speed, the characteristics at boundary surface between the gate insulation film and a semiconductor serving as the active layer must be good and the carrier concentration of the semiconductor layer must be also high.

FIGS. 1a to 1e are sectional views showing a method for fabricating a conventional thin film transistor.

In accordance with the illustrated method, a polysilicon layer 2 to be used as an active layer is deposited on the whole surface of an insulation transparent substrate 1 such as glass or quartz, as shown in FIG. 1a.

As shown in FIG. 1b, thereafter, the polysilicon layer 2 is patterned using a photo lithography process and an etch process so that it is remained merely at the active layer.

A gate insulation film 3 and a conductive layer 4 to be used as a gate electrode are then formed on the whole surface of the resulting structure, in this order.

As shown in FIG. 1c, subsequently, a gate electrode region is defined using a photo resist 5 for defining and an unnecessary portion of the conductive layer 4 is removed using the photo resist 5 as an etch mask to form a gate electrode 4a.

Impurity ions are implanted in the polysilicon 2 using the gate electrode 4a as an implantation mask, to form a source region 2a and a drain region 2b in the polysilicon layer 2 corresponding to both sides of the gate electrode 4a.

As shown in FIG. 1d, thereafter, a protection film 6 is deposited on the whole surface of the resulting structure.

As shown in FIG. 1e, subsequently, the protection film 6 and the gate insulation film 3 are selectively removed so that the source region 2a and the drain region 2b are exposed, to form a contact hole.

Thereafter, a source electrode 7 and a drain electrode 7a are formed so that they are connected to the source region 2a and the drain region 2b, respectively.

However, the conventional method for fabricating a thin film transistor has the following problems.

First, since the gate insulation film 3 is formed after the polysilicon layer 2 and the active region are formed using the photo resist 5, several type of impurities are flowed upon patterning the polysilicon layer 2 and the photo resist 5 is remained even after the polysilicon layer 2 is patterned, thereby causing the characteristics at the boundary surface between the gate insulation film 3 and the polysilicon layer 2 which is the active layer to be deteriorated.

Second, since impurity ions are implanted in the polysilicon layer through the gate insulation film 3 using the gate electrode as an ion-implantation mask after the gate electrode 4a, a considerable-high energy is required to implant impurity ions in the polysilicon layer through the gate insulation film 3 which has a thickness of above 1000Å, in general. It is also difficult to exactly adjust the quantity of impurity ions which reach to the source region and the drain region.

Accordingly, there is a disadvantage in that it is difficult to obtain a thin film transistor capable of operating in high speed.

SUMMARY OF THE INVENTION

Therefore, an object of the invention is to provide a method for fabricating a thin film transistor capable of improving the characteristics at boundary surface between the active layer and the gate insulation film, thereby enabling the fabrication process to be simplified and enabling the characteristics of thin film transistor to be improved.

In accordance with the present invention, this object can be accomplished by providing a method for fabricating a thin film transistor comprising the steps of: depositing a semiconductor layer serving as an active layer, a first gate insulation film and an second gate insulation film on an insulation-transparent substrate, in this order;

Patterning the second gate insulation film using a mask for the patterning of an active region so that it is remained merely at the active region;

oxidizing the semiconductor layer except for the active region using the patterned second gate insulation film as an oxidization mask, to isolate the active region from the other portion;

forming a gate electrode on the second gate insulation film corresponding to the upper side of the defined active region;

implanting impurity-ions in the semiconductor layer using the gate electrode as an ion-implantation mask to form a source region and a drain region;

forming a protection film on the whole exposed surface of the resultant structure;

forming contact holes in the protection layer so that the source region and the drain region are exposed; and forming a source electrode and a drain electrode, so that they are connected to the source region and the drain region, respectively, via the contact holes.

BRIEF DESCRIPTION OF THE DRAWINGS

Other objects and aspects of the invention will become apparent from the following description of embodiments with reference to the accompanying drawing in which:

FIGS. 2a to 2h are sectional views illustrating a method for fabricating a thin film transistor in accordance with the present invention.

DETAILED DESCRIPTION OF THE PREFERRED EMBODIMENT

Figure 1A:
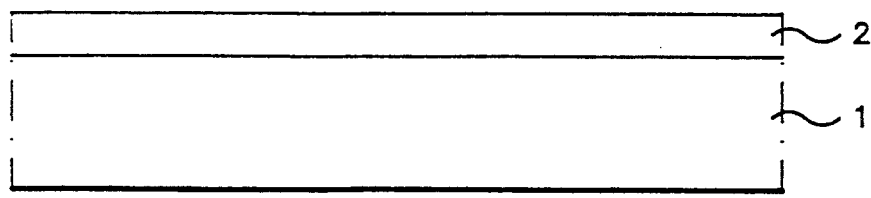
FIGS. 1a to 1e are sectional views illustrating a conventional method for fabricating a thin film transistor.
Figure 1B:
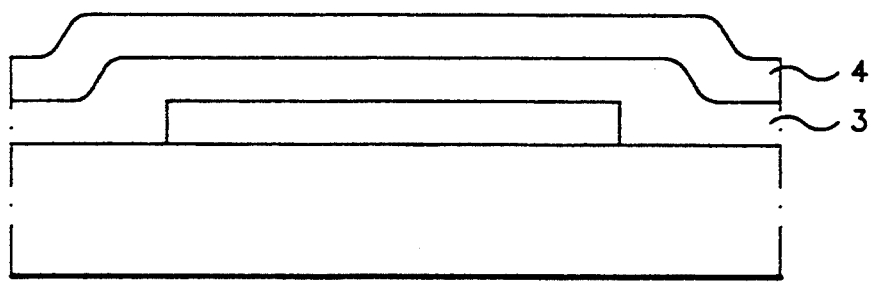
Figure 1C:
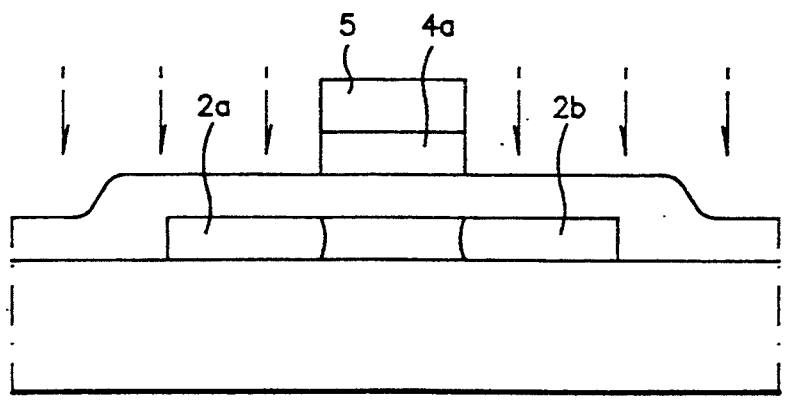
Figure 1D:
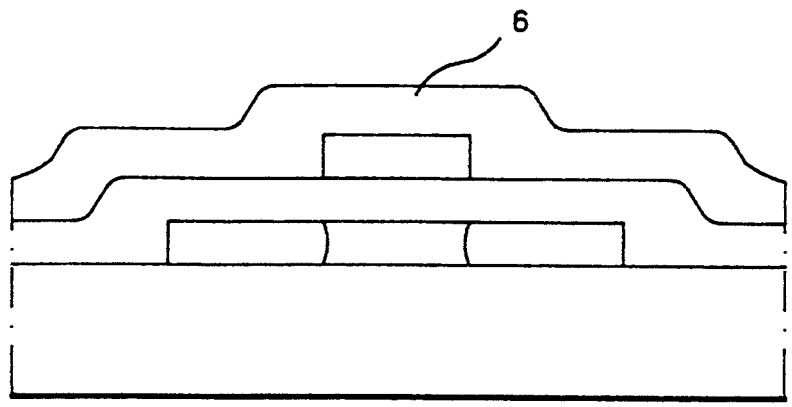
Figure 1E:
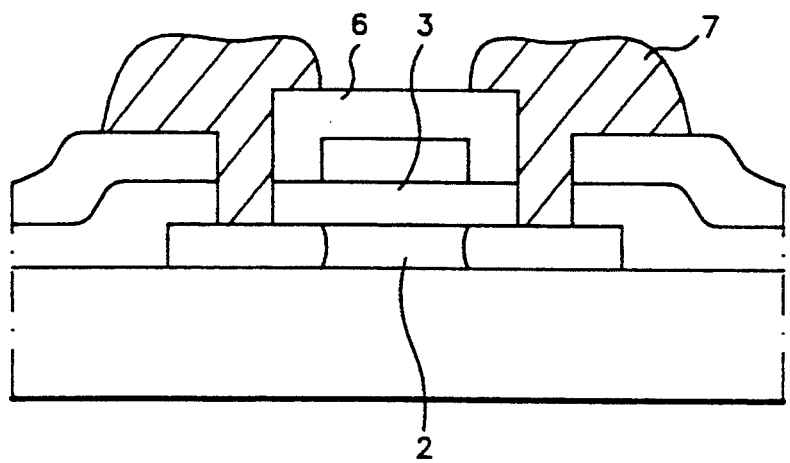

Hereinafter, the present invention will be described with reference to FIGS. 2a to 2h.

Referring to FIGS. 2a to 2h, there is illustrated a method for fabricating a thin film transistor in accordance with the present invention.

First, a polysilicon layer 2 to be used as an active layer on a substrate 1 such as glass substrate or insulation substrate, as shown in FIG. 2a.

As shown in FIGS. 2b and 2c, an oxide film 8 to be used as a first gate insulation film and an silicon nitride film 9 to be used as a second insulation film are deposited, in this order.

At this time, the oxide film 8 is formed with a thickness of 50Å–300Å using a chemical vapour deposition(CVD) method or a thermal oxidation method and the silicon nitride film 9 is then formed on the oxide film 8 with a thickness of 300Å–1000Å using a CVD method or a plasma enhanced CVD method or a low pressure CVD method.

As shown in FIG. 2d, a photo resist 5 is deposited on the silicon nitride film 9 and then subjected to an exposure process and a development process using a mask for the patterning of active region, to define the active region. Thereafter, an unnecessary portion of the silicon nitride film 9 is removed except for the active layer, using the mask.

As shown in FIG. 2e, so as to form the isolation region of active layer, the polysilicon layer 2 is oxidized thermally with a dry or wet method using the remained silicon nitride film 9 as a mask at a portion in which the unnecessary portion of the silicon nitride film 9 is removed, to form a thermal oxide 10.

Thereafter, the photo resist 5 is removed.

At this time, the polysilicon 2 is oxidized until the isolation region of active layer is formed completely.

As shown in FIG. 2f, a conductive material 4 to be used as a gate electrode is deposited on the whole surface of the resultant structure and a photo-resist 11 is then deposited on the conductive material 4 as shown in FIG. 2g.

Thereafter, the photo-resist 11 is subjected to an exposure process and a development process using a mask for gate electrode to define a gate electrode region the conductive material 4 and the silicon-nitride film 9 are then patterned using the defined photo-resist 11 as an etch mask to form a gate electrode 4a.

Subsequently, impurity ions of a proper dose are implanted in the polysilicon layer (2) corresponding to the active region with a proper energy, to form a source region 2a and a drain region 2b.

At this time, p-type or n-type of impurity ions are implanted in accordance with a desired channel type.

As shown in FIG. 2h, the defined photo-resist 11 is removed and a protection film 6 is then formed.

The protection film 6 and the oxide film 8 are selectively removed so that the source region 2a and the drain region 2b are exposed, to form contact holes.

Subsequently, a metal 7 is deposited so that it is connected to the source region 2a and the drain region 2b via the contact holes. So as to complete the fabrication of transistor, the metal 7 is then patterned to a source electrode and a drain electrode.

As above mentioned, the present invention first forms the gate insulation film with a double structure without patterning the active region. Thereafter, the upper layer of the gate insulation film (that is, silicon-nitride layer) is patterned to define the active region and the other portion excepting the active region is insulated using the patterned upper layer of the gate insulation film as a mask in condition that the active region is not exposed.

Therefore, it is possible to solve the problem in which the photo-resist is remained after the active layer is patterned.

In can be also prevented to deteriorate the characteristics in boundary surface between the active region and the gate insulation film.

Since the gate insulation film is comprised of an oxide film and a nitride film with a double structure, and impurity ions are implanted to form a source region and a drain region after the silicon nitride corresponding to the source region and the drain region is first removed, the gate insulation film becomes thin on the source region and the drain region, thereby enabling the processes for forming the source region and the drain region to be easily done.

What is claimed is:

1. A method for fabricating a thin film transistor comprising the steps of:

depositing a semiconductor layer serving as an active layer, a first gate insulation film and a second gate insulation film on an insulation transparent substrate, in this order;

patterning the second gate insulation film using a mask for the patterning of an active region so that it is remained merely at the active region;

oxidizing the semiconductor layer except for the active region using the patterned second gate insulation film as an oxidization mask, to isolate the active region from the other portion;

forming a gate electrode on the second gate insulation film corresponding to the upper side of the defined active region;

implanting impurity-ions in the semiconductor layer using the gate electrode as an ion-implantation mask to form a source region and a drain region;

forming a protection film on the whole exposed surface of the resultant structure;

forming contact holes in the protection layer so that the source region and the drain region are exposed; and forming a source electrode and a drain electrode, so that they are connected to the source region and the drain region, respectively, via the contact holes.

2. A method for fabricating a thin film transistor in accordance with claim 1, wherein the first gate insulation film is made of an oxide ($SiO_2$) and the second gate insulation film is made of a silicon-nitride.

3. A method for fabricating a thin film transistor in accordance with claim 1, wherein the semiconductor layer is made of a polysilicon.

4. A method for fabricating a thin film transistor in accordance with claim 1, the thickness of first gate insulation film is 50Å to 300Å.

5. A method for fabricating a thin film transistor in accordance with claim 1, the thickness of second gate insulation film is 300Å to 1000Å.

* * * * *